(12) United States Patent
Nakamura

(10) Patent No.: US 7,679,006 B2
(45) Date of Patent: Mar. 16, 2010

(54) PRINTED WIRING BOARD

(75) Inventor: Naoki Nakamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 91 days.

(21) Appl. No.: 11/896,520

(22) Filed: Sep. 4, 2007

(65) Prior Publication Data

US 2008/0000681 A1    Jan. 3, 2008

Related U.S. Application Data

(63) Continuation of application No. PCT/JP2005/005230, filed on Mar. 23, 2005.

(51) Int. Cl.
H01R 12/04 (2006.01)
H05K 1/11 (2006.01)

(52) U.S. Cl. ....................... 174/262; 361/792

(58) Field of Classification Search ......... 174/262–266; 361/792–795
See application file for complete search history.

(56) References Cited

U.S. PATENT DOCUMENTS

| | | | |
|---|---|---|---|
| 5,828,555 A | 10/1998 | Itoh | |
| 7,081,650 B2 * | 7/2006 | Palanduz et al. | ............. 257/310 |
| 2002/0153167 A1 * | 10/2002 | Miller | ......................... 174/261 |

FOREIGN PATENT DOCUMENTS

| | | |
|---|---|---|
| JP | 4-62894 A | 2/1992 |
| JP | 5-29767 A | 2/1993 |
| JP | 8-111589 A | 4/1996 |
| JP | 10-41630 A | 2/1998 |
| JP | 2000-183541 A | 6/2000 |
| JP | 2000-216513 A | 8/2000 |
| JP | 2001-244635 A | 9/2001 |
| JP | 2002-217543 A | 8/2002 |

OTHER PUBLICATIONS

Japanese Office Action dated Oct. 29, 2008 (mailing date), issued in corresponding Japanese Patent Application No. 2007-509117.
International Search Report of PCT/JP2005/005230, date of mailing Mar. 23, 2005.
International Preliminary Report on Patentability for PCT/JP2005/005230 mailed on Oct. 4, 2007.

* cited by examiner

Primary Examiner—Jeremy C Norris
(74) Attorney, Agent, or Firm—Westerman, Hattori, Daniels & Adrian, LLP

(57) ABSTRACT

A signal line, a power supply pattern and a ground layer are formed within a board. An outer via and an inner via are formed within the board. The outer via is connected to the signal line. The inner via is connected to the ground layer. The outer via serves as a signal line. The inner via serves as a ground. The signal line within a printed wiring board is connected to the outer via without interruption by a ground. The signal lines can spread within the printed wiring board in a complicated pattern as compared with a conventional pattern. Moreover, the impedance matching can reliably be established.

4 Claims, 5 Drawing Sheets

PRINTED WIRING BOARD

BACKGROUND OF THE INVENTION

1. Field of the Invention

The present invention relates to a printed wiring board.

2. Description of the Prior Art

In general, wiring patterns are formed on the front and back surfaces of a substrate for signal lines in a printed wiring board. The signal lines on the front and back surfaces are connected to each other through a via penetrating through the substrate, for example. A ground via is also formed outside the via for the signal lines. The ground via is coaxial with the via for the signal lines. Coaxial cable lines are established in the substrate in this manner. The ground via serves to trap noise of the signal lines.

Proposed is a so-called multilayered printed wiring board. Double-sided wiring boards are overlaid on one another in sequence. If the aforementioned coaxial vias are formed in such a multilayered structure, the ground via prevents connection between signal lines inside the multilayered wiring board because the ground via surrounds the via for signal lines. However, a high-speed signal transmission cannot be realized without the ground via.

SUMMARY OF THE INVENTION

It is accordingly an object of the present invention to provide a printed wiring board significantly contributing to realization of a high-speed signal transmission.

According to a first aspect of the present invention, there is provided a printed wiring board comprising: a board; a signal line formed in the board; a ground layer formed on the surface of the board; an outer via formed in the board, the outer via connected to the signal line; and an inner via located inside the outer via in the board, the inner via connected to the ground layer.

The outer via serves as a signal line in the printed wiring board. The inner via serves as a ground. The signal line in the printed wiring board can be connected to the outer via without interruption by a ground. The signal lines can thus spread within the printed wiring board in a complicated pattern as compared with a conventional pattern. The printed wiring board can be utilized not only as a so-called package substrata but also a large-scale substrate such as a motherboard.

In addition, the inner via serving as a ground is located inside the outer via serving as a signal line. The impedance matching can reliably be established. This results in a reliable signal transmission between components mounted on the printed wiring board. The printed wiring board allows the transmission of a high speed exceeding several GHz.

According to a second aspect of the present invention, there is provided a printed wiring board comprising: a board; a signal line formed in the board; an electrically-conductive film uniformly formed on the surface of the board; an outer via connected to the signal line formed in the board; and an inner via located inside the outer via in the board, the inner via connected to the electrically-conductive film.

The outer via serves as a signal line in the printed wiring board. The inner via serves as a ground and a power supply pattern, for example. The signal line within the printed wiring board can be connected to the outer via without interruption by a ground and a power supply pattern. The signal lines can thus spread within the printed wiring board in a complicated pattern as compared with a conventional pattern in the same manner as described above. The printed wiring board can be utilized not only as a so-called package substrata but also a large-scale substrate such as a motherboard.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
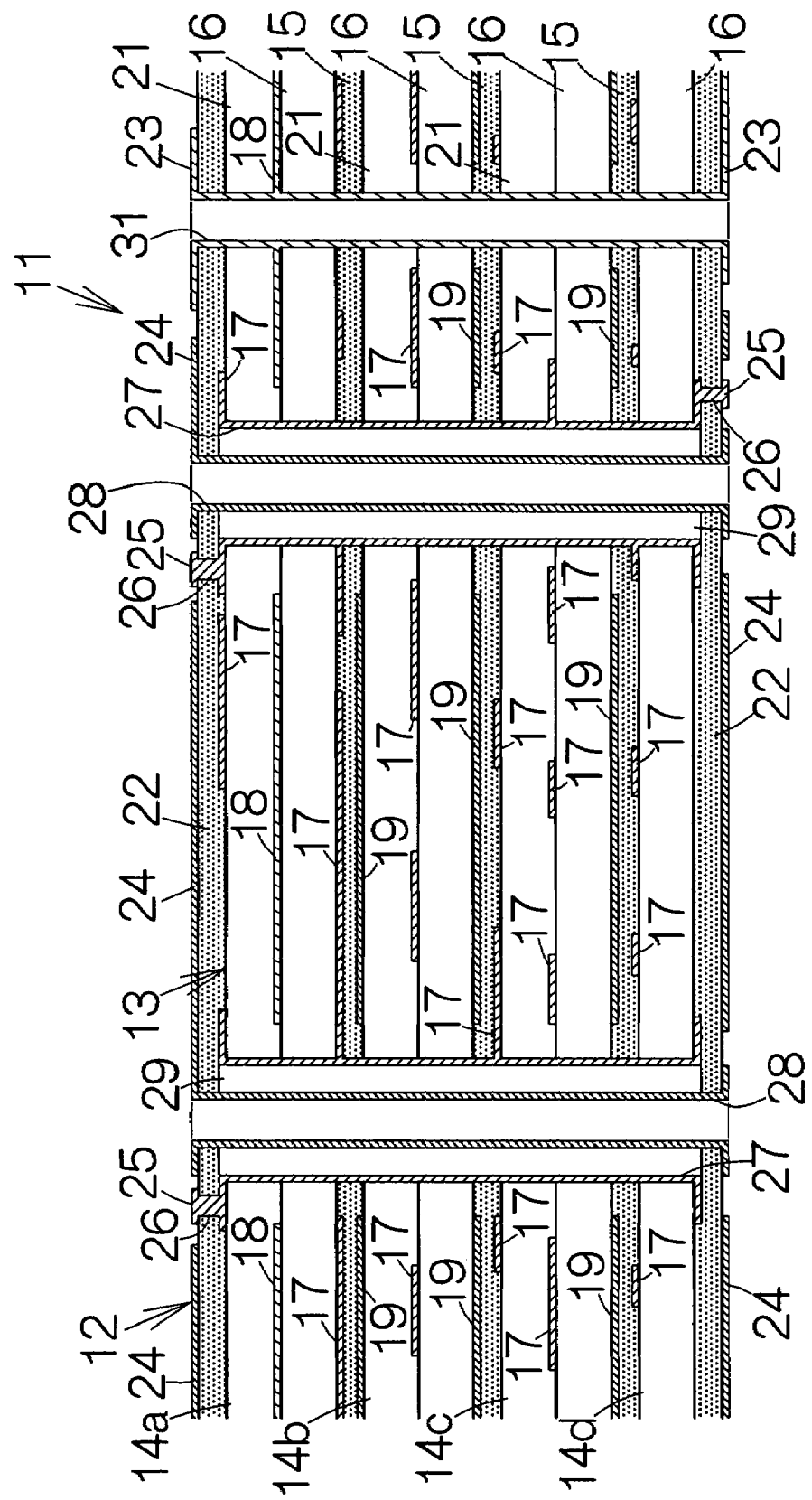
FIG. 1 is a vertical sectional view illustrating a printed wiring board unit according to an embodiment of the present invention.

FIG. 1 illustrates a printed wiring board unit according to an embodiment of the present invention. The printed wiring board unit 11 includes a printed wiring board 12 having a multilayered structure. The printed wiring board 12 includes a board 13. Component substrates 14*a*, 14*b*, 14*c*, 14*d* are incorporated in the board 13. The component substrates 14*a*, 14*b*, 14*c*, 14*d* are overlaid on one another. An insulating resin layer 15 such as a prepreg is interposed between the adjacent ones of the component substrates 14*a*, 14*b*, 14*c*, 14*d*. The insulating resin layers 15 serve to bond the adjacent component substrates 14*a*, 14*b*, 14*c*, 14*d* to each other.

The component substrates 14*a*-14*d* each include a core substrate 16. The core substrate 16 is made of a resin material, a ceramic material, or the like. The core substrate 16 has a rigidity sufficient to maintain its shape by itself.

A signal line pattern or patterns 17, a power supply pattern or patterns 18 and a ground pattern or patterns 19 may be formed on the front and back surfaces of the core substrates 16, for example. The power supply pattern 18 and the ground pattern 19 may be an electrically-conductive film uniformly overspreading the front or back surface of the core substrates 16, for example. In this case, the power supply pattern 18 may be divided into sections for receiving different supplied voltages. Further substrates 21 may be overlaid on the front and back surfaces of the core substrates 16. The signal line pattern 17, the power supply pattern 18 and the ground pattern 19 are likewise formed on the surfaces of the substrates 21. The signal line patterns 17, the power supply patterns 18 and the ground patterns 19 are made of a metallic thin film such as a copper foil, for example.

An insulating layer 22 is formed on each of the front and back surfaces of the board 13. The insulating layer 22 may be made of an insulating resin material such as prepreg, for example, in the same manner as described above. A power supply pattern 23 and a ground pattern 24 are formed on the surface of the insulating layer 22, for example. The power supply pattern 23 and the ground pattern 24 may be an electrically-conductive film uniformly overspreading the surface of the insulating layer 22, for example, in the same manner as described above. The power supply pattern 23 and the ground pattern 24 may be made of a metallic thin film such as a copper foil, for example.

An electrically-conductive terminal pad or pads 25 are formed on the surface of the insulating layer 22 at a position off the power supply pattern 23 and the ground pattern 24. The terminal of a component, not shown, is bonded to the terminal pad 25. A ball bump can be utilized as the terminal, for example. Solder is utilized to bond the component, for example. The terminal pad 25 is connected to the signal line pattern 17 within the board 13 through a bottomed via 26. A wiring pattern and a terminal pad may be formed on the surface of the insulating layer 22 for connection to the electrically-conductive pad 25.

An outer via 27 and an inner via 28 are formed in the board 13. The inner via 28 is formed inside the outer via 28. The inner via 28 is coaxial with the outer via 27. The outer via 27 and the inner via 28 are formed of a cylindrical wall made of a metallic material such as copper, for example. An insulating body 29 is filled in between the outer via 27 and the inner via 28. The insulating body 29 serves to electrically insulate the outer via 27 and the inner via 28 from each other. The outer via 27 is connected to the signal line patterns 17 on the front and back surfaces of the board 13 and the signal line patterns 17 within the board 13. The inner via 28 is connected to the ground patterns 24 formed on the surfaces of the insulating layers 22. A via or vias 31 may also be formed in the board 13 so as to connect the power supply patterns 23 and the ground patterns 24 on the surfaces of the insulating layers 22 to the power supply patterns 18 and the ground patterns 19 within the board 13. The via 31 may be made of a metallic material such as copper, for example.

The printed wiring board 12 allows connection between the outer via 27 and the signal line patterns 17 on the component substrates 14a-14d at a position outside the inner via 28 serving as a ground. The components can thus be electrically connected to each other through a complicated pattern as compared with a conventional pattern. The printed wiring board 12 can be utilized not only as a so-called package substrate but also a large-scale substrate such as a motherboard.

In addition, since the inner via 28 serving as a ground is located inside the outer via 27 serving as a signal line, the impedance matching can reliably be established. This results in a reliable signal transmission between the components on the printed wiring board 12.

Figure 2:
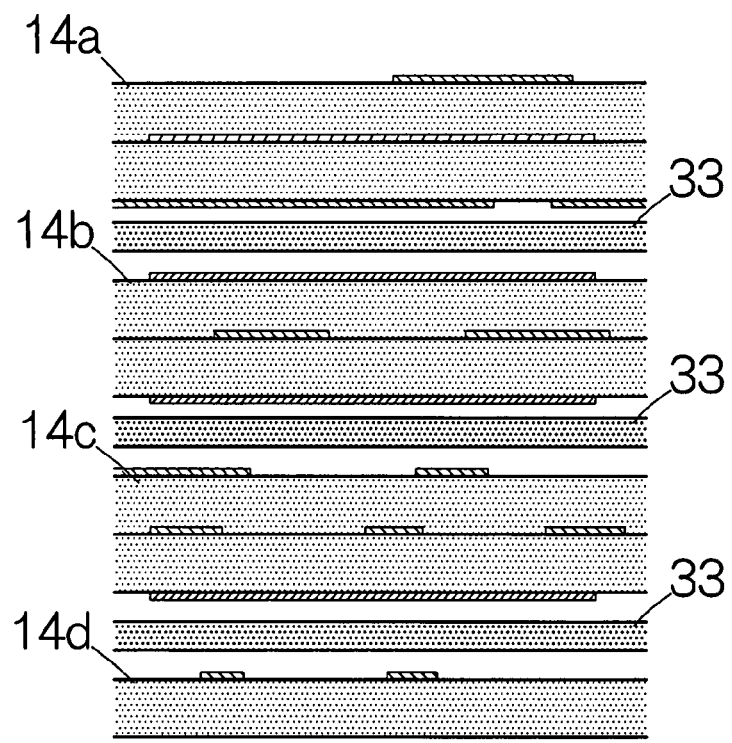
FIG. 2 is a vertical sectional view illustrating component substrates bonded to one another.

The component substrates 14a-14d are first prepared in a method of making the printed wiring board 12. The component substrate 14a-14b may be made in a conventional manner. The component substrates 14a-14b are overlaid on one another in sequence. A prepreg 33 is interposed between the adjacent component substrates 14a-14d, as shown in FIG. 2, for example. Pressure is then applied to a mass of the component substrates 14a-14b with a press. The prepregs 33 serve to bond the adjacent component substrates 14a-14d to each other. The board 13 is made in this manner.

Figure 3:
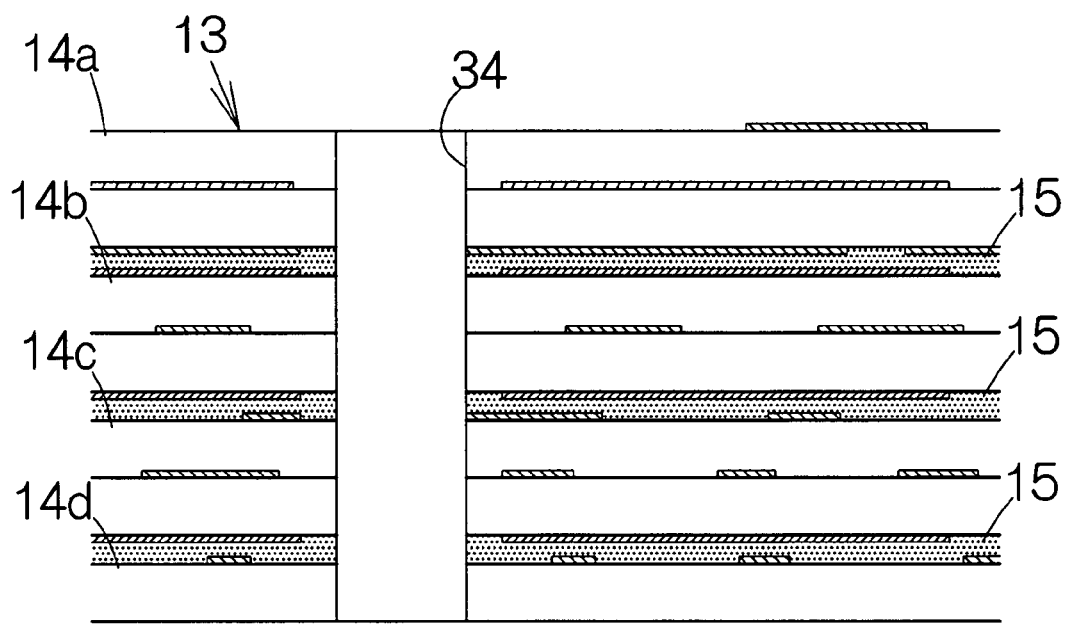
FIG. 3 is a vertical sectional view illustrating a through hole formed in a board for an outer via.
Figure 4:
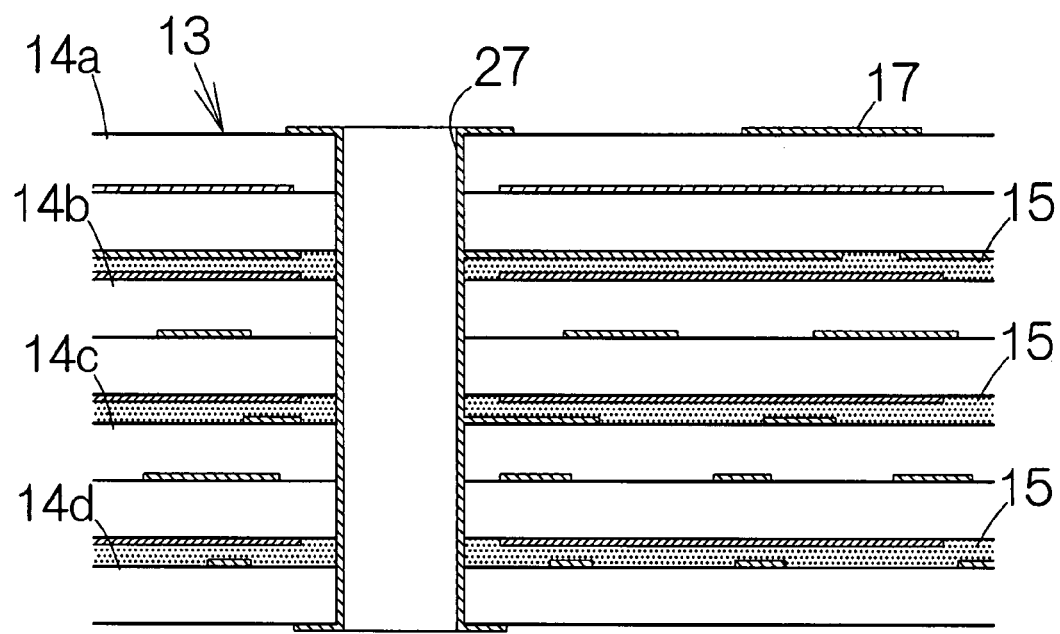
FIG. 4 is a vertical sectional view illustrating the outer via formed within the board.

A through hole 34 is then formed in the board 13, as shown in FIG. 3, for example. The through hole 34 penetrates through the component substrates 14a-14d at a predetermined position. Plating process is then applied. This results in establishment of the signal line patterns 17 on the front and back surfaces of the board 13. The outer via 27 is also formed in the through hole 34, as shown in FIG. 4. The outer via 27 is connected to the signal line patterns 17.

Figure 5:
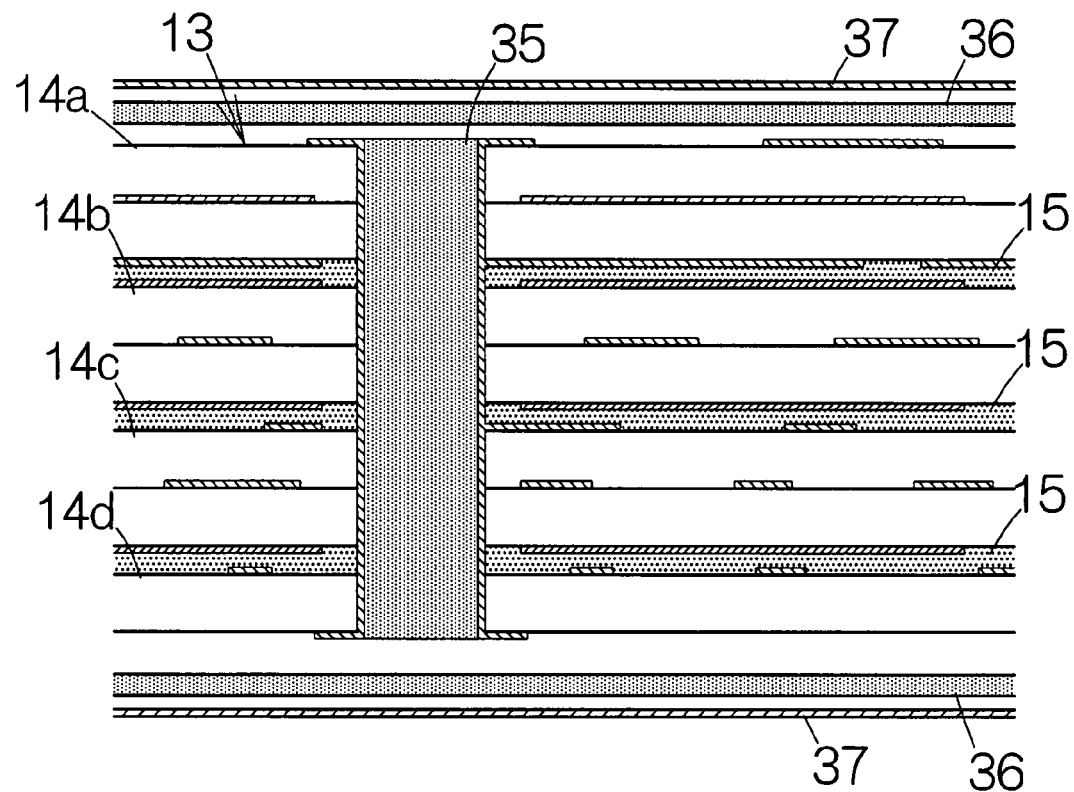
FIG. 5 is a vertical sectional view illustrating copper foils attached to the board.
Figure 6:
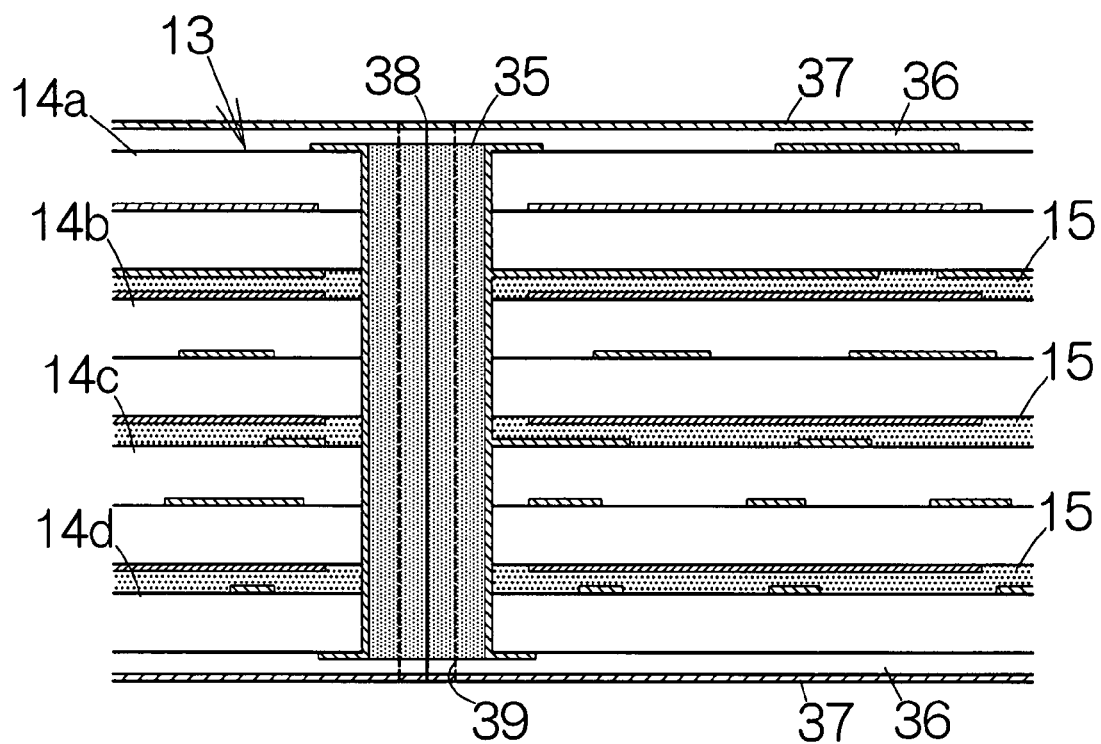
FIG. 6 is a vertical sectional view illustrating a through hole formed inside the outer via.

A resin material 35 is filled in the outer via 27, as shown in FIG. 5, for example. A prepreg 36 and a copper foil 37 are laminated on the front and back surfaces of the board 13 in sequence. A reference hole 38 is formed on the central axis of the outer via 27, as shown in FIG. 6, for example. X rays are utilized to form the reference hole 38, for example. The reference hole 38 is utilized to bore a through hole 39 coaxial with the outer via 27. When the through hole 39 is subjected to plating, the inner via 28 is formed. The inner via 28 is connected to the copper foils 37 on the front and back surfaces of the board 13, for example. The power supply patterns 23 and the ground patterns 24 are formed out of the copper foils 37. The printed wiring board 12 is made in this manner.

Figure 7:
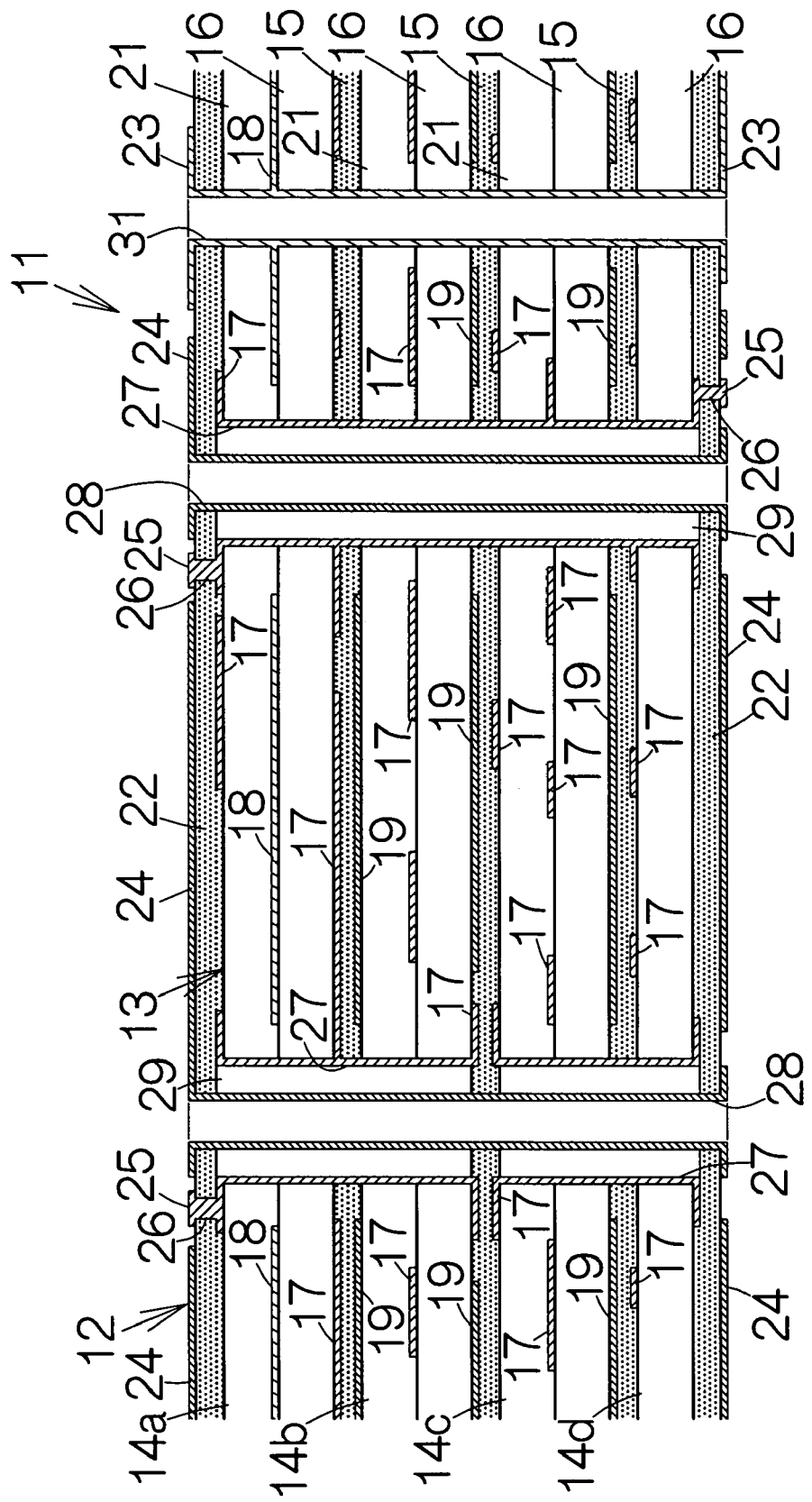
FIG. 7 is a vertical sectional view illustrating a printed wiring board unit according to another embodiment of the present invention.

As shown in FIG. 7, for example, a single inner via 28 may be formed inside serial outer vias 27 in the printed wiring board 12.

What is claimed is:

1. A printed wiring board comprising:
   a board;
   a signal line formed in the board;
   an insulating layer formed on a surface of the board;
   a ground layer formed on a surface of the insulating layer;
   an electrically-conductive terminal pad formed on the surface of the insulating layer at a position off the ground layer, the electrically-conductive pad connected to the signal line;
   an outer via formed in the board, the outer via connected to the signal line; and
   an inner via located inside the outer via in the board, the inner via connected to the ground layer.

2. The printed wiring board according to claim 1, wherein the inner via is coaxial with the outer via in the printed wiring board.

3. The printed wiring board according to claim 1, wherein the inner via penetrates through the board.

4. A printed wiring board comprising:
   a board;
   a signal line formed in the board;
   an insulating layer uniformly formed on a surface of the board;
   an electrically-conductive film uniformly formed on a surface of the insulating layer;
   an electrically-conductive terminal pad formed on the surface of the insulating layer at a position off the electrically-conductive film, the electrically-conductive pad connected to the signal line;
   an outer via connected to the signal line formed in the board; and
   an inner via located inside the outer via in the board, the inner via connected to the electrically-conductive film.

* * * * *